(12) United States Patent
Yoshima et al.

(10) Patent No.: US 9,722,545 B2
(45) Date of Patent: Aug. 1, 2017

(54) EMPHASIS CIRCUIT

(71) Applicants: Satoshi Yoshima, Chiyoda-ku (JP);
Masaki Noda, Chiyoda-ku (JP);
Masamichi Nogami, Chiyoda-ku (JP)

(72) Inventors: Satoshi Yoshima, Chiyoda-ku (JP);
Masaki Noda, Chiyoda-ku (JP);
Masamichi Nogami, Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 0 days.

(21) Appl. No.: 14/767,983

(22) PCT Filed: Mar. 4, 2013

(86) PCT No.: PCT/JP2013/055814
§ 371 (c)(1),
(2) Date: Aug. 14, 2015

(87) PCT Pub. No.: WO2014/136170
PCT Pub. Date: Sep. 12, 2014

(65) Prior Publication Data
US 2015/0381115 A1   Dec. 31, 2015

(51) Int. Cl.
*H03F 3/45*   (2006.01)
*H03F 1/02*   (2006.01)
(Continued)

(52) U.S. Cl.
CPC ............. *H03F 1/0288* (2013.01); *H03F 1/42* (2013.01); *H03F 3/19* (2013.01); *H03F 3/191* (2013.01);
(Continued)

(58) Field of Classification Search
CPC .................................................. H03F 3/45098
(Continued)

(56) References Cited

U.S. PATENT DOCUMENTS

| 6,703,899 B2 * | 3/2004 | Harberts | H03G 1/0088 330/254 |
| 8,295,336 B2 | 10/2012 | Lutz et al. | |
| 2008/0218222 A1 | 9/2008 | Nishi | |

FOREIGN PATENT DOCUMENTS

| JP | 2004-88693 A | 3/2004 |
| JP | 2008-219895 A | 9/2008 |

(Continued)

OTHER PUBLICATIONS

G. Evelina Zhang, et al., "A 10 Gb/s BiCMOS Adaptive Cable Equalizer," IEEE Journal of Solid-State Circuits, vol. 40, No. 11, Nov. 2005, pp. 2132-2040.

(Continued)

*Primary Examiner* — Khanh V Nguyen
*Assistant Examiner* — Khiem Nguyen
(74) *Attorney, Agent, or Firm* — Oblon, McClelland, Maier & Neustadt, L.L.P.

(57) ABSTRACT

Provided is an emphasis circuit capable of obtaining a desired emphasis amount with which waveform deterioration of an output signal in a high frequency band (high frequency band deterioration) is suppressed without increasing power consumption (current consumption). In the emphasis circuit, a baseband amplifier section and a peaking amplifier section are connected in parallel to each other, and respective drive current setting sections are adjusted to adjust respective drive current values thereof so that the sum of the drive current value of the baseband amplifier section and the drive current value of the peaking amplifier section may be constant.

9 Claims, 5 Drawing Sheets

(51) Int. Cl.
    *H03F 3/21* (2006.01)
    *H03F 3/19* (2006.01)
    *H03G 3/30* (2006.01)
    *H03F 1/42* (2006.01)
    *H03F 3/191* (2006.01)
    *H03G 9/24* (2006.01)

(52) U.S. Cl.
    CPC ......... *H03F 3/211* (2013.01); *H03F 3/45098* (2013.01); *H03G 3/3036* (2013.01); *H03G 9/24* (2013.01); H03F 2203/45038 (2013.01); H03F 2203/45296 (2013.01); H03F 2203/45298 (2013.01); H03F 2203/45372 (2013.01); H03F 2203/45374 (2013.01); H03F 2203/45396 (2013.01); H03F 2203/45494 (2013.01); H03F 2203/45594 (2013.01)

(58) Field of Classification Search
    USPC ........................................ 330/253, 254, 261
    See application file for complete search history.

(56) References Cited

FOREIGN PATENT DOCUMENTS

| | | |
|---|---|---|
| JP | 2009-147512 A | 7/2009 |
| JP | 2011-160185 A | 8/2011 |

OTHER PUBLICATIONS

International Search Report issued Apr. 2, 2013 in PCT/JP2013/055814 filed Mar. 4, 2013.

\* cited by examiner

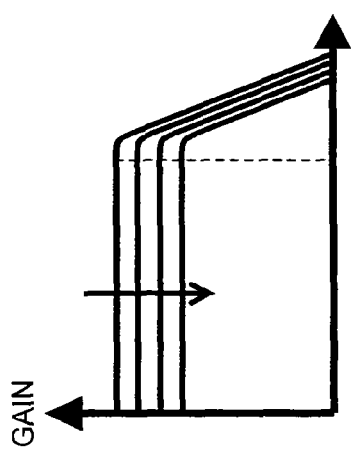
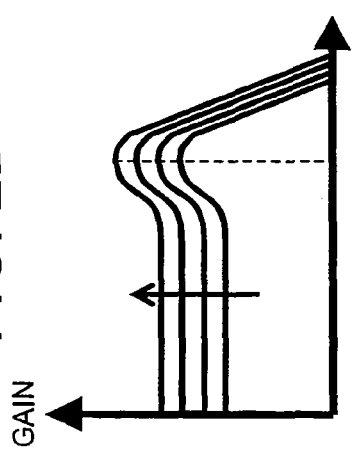
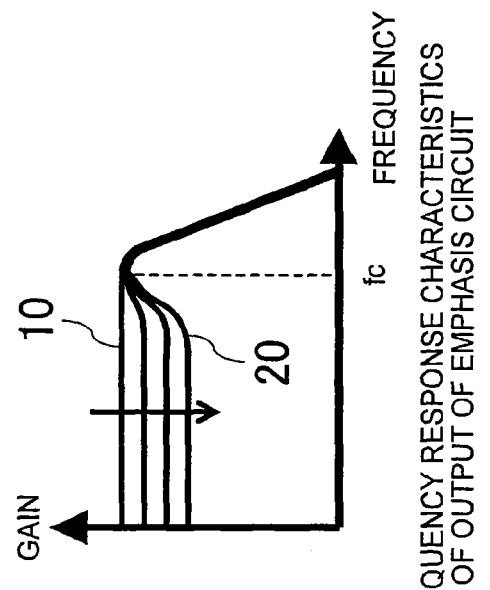

US 9,722,545 B2

EMPHASIS CIRCUIT

TECHNICAL FIELD

The present invention relates to an emphasis circuit to be applied to an analog front-end circuit mounted on an optical transceiver in an optical communication system, and more particularly, to an emphasis circuit to be connected at a subsequent stage of a preamplifier (transimpedance amplifier: TIA), which is called a limiting amplifier or a main amplifier as a receiver side circuit.

BACKGROUND ART

Hitherto, when an output signal (high frequency signal) amplified by a preamplifier is transmitted through a channel, there is a problem in that a high frequency component of the output signal is attenuated during the transmission, and the waveform thereof deteriorates due to a dull rising/falling edge. In order to avoid such waveform deterioration, an emphasis function needs to be implemented so as to increase the amplitude of a signal only in the vicinity of a rising/falling edge thereof, to thereby compensate for waveform deterioration in a high frequency band in a signal output line.

Then, there is an emphasis circuit that includes a delay circuit, a main output driver, an emphasis output driver, and an output driver in order to implement the emphasis function (see, for example, Patent Literature 1). In this emphasis circuit, an input differential signal is branched into two signals and added with a predetermined delay amount by the delay circuit inserted in one signal propagation line. The signals are input to the main output driver in the other signal propagation line in which the delay circuit is not inserted, and are input to the emphasis output driver in the signal propagation line in which the delay circuit is inserted. Then, a positive phase output of the main output driver and a negative phase output of the emphasis output driver are multiplexed, and a common output load resistor is driven by the output driver.

Further, there is another emphasis circuit that includes a flat-response amplifier block (baseband amplifier), a band pass filter (BPF), a peak-response amplifier block (peaking amplifier), and an adder circuit (linear amplifier) in order to implement the emphasis function. In this emphasis circuit, an input differential signal is branched into two signals, and the output amplitude of the baseband is determined by the flat-response amplifier block. Further, due to the peak-response amplifier block having the band pass filter inserted at an input section thereof, the gain peak can be provided in such a high frequency band (for example, 6 GHz to 8 GHz) that has a large loss in an output line. Then, an output from the flat-response amplifier block and an output from the peak-response amplifier block are multiplexed, and an output load resistor is driven by the adder circuit.

Further, there is another method for implementing a peaking amplifier by adding the inductance to a load resistor without inserting the band pass filter (BPF) at the input section, although this method is applied to an equalizer function on the receiver side rather than an emphasis function on the transmitter side (see, for example, Non Patent Literature 1).

CITATION LIST

Patent Literature

JP 2004-088693 A (PTL 1)
JP 2011-160185 A (PTL 2)

Non Patent Literature

[NPL 1] G. Evelina Zhang and M. M. Green, "A 10 Gb/s BiCMOS Adaptive Cable Equalizer," IEEE J. Solid-State Circuits, vol. 40, no. 11, November 2005, pp. 2132-2040.

SUMMARY OF INVENTION

Technical Problems

However, the related art has the following problems.

In the related art disclosed in Patent Literature 1, the delay circuit is necessary in order to implement the emphasis function, and such a circuit as a D-FF, which is commonly used as a delay circuit, needs an external clock source synchronized with transmission signal speed. Thus, there is a problem in that this configuration cannot be applied when an external clock source is not built as an optical transceiver (for example, 10G Ethernet (trademark) SFP+, and the like).

Further, in the case where amplifiers such as differential pairs are connected in multiple stages as a delay circuit, a considerable number of amplifiers need to be connected in multiple stages in order to obtain a desired delay amount, resulting in a problem in that power consumption is increased.

Further, in the related art disclosed in Patent Literature 2, the output load resistor (for example, 50Ω in a commonly-used high frequency signal line for data communication) needs to be driven by the linear amplifier. Thus, the implementation of the emphasis function needs to increase a drive current in order to increase the amplitude of a signal only in the vicinity of a rising/falling edge thereof, resulting in a problem in that power consumption is increased.

Further, in the related art disclosed in Non Patent Literature 1, the function as the peaking amplifier is implemented by an inductor load. However, the inductance has a large footprint, resulting in a problem in that the chip area is increased.

The present invention has been made in order to solve the above-mentioned problems, and it is an object thereof to provide an emphasis circuit capable of obtaining a desired emphasis amount with which waveform deterioration of an output signal in a high frequency band (high frequency band deterioration) is suppressed without increasing power consumption (current consumption).

Solution to Problems

According to one embodiment of the present invention, there is provided an emphasis circuit for outputting a signal having frequency response characteristics that provide a desired gain depending on a frequency as a main signal output in response to differential input signals formed of a positive phase input signal and a negative phase input signal, the emphasis circuit including: a baseband amplifier section for outputting a first output signal obtained by amplifying the differential input signals based on first frequency response characteristics in which a gain is constant up to near a first predetermined frequency and the gain becomes smaller over a whole frequency band as a first drive current value for operating the baseband amplifier section becomes smaller; a peaking amplifier section for outputting a second output signal obtained by amplifying the differential input signals based on second frequency response characteristics in which a gain peaks near a second predetermined frequency and the gain becomes larger over the whole frequency band as a second drive current value for operating the peaking amplifier section becomes larger; and a signal multiplexing section for outputting a multiplexed signal obtained by multiplexing the first output signal and the second output signal as the main signal output, in which each of the baseband amplifier section and the peaking amplifier section includes a drive current setting section capable of adjusting a drive current value for operating the each of the baseband amplifier section and the peaking amplifier section, and the drive current setting section of the each of the baseband amplifier section and the peaking amplifier section is adjusted so that a sum of the first drive current value for operating the baseband amplifier section and the second drive current value for operating the peaking amplifier section is constant, to thereby obtain a desired emphasis amount with which high frequency band deterioration is suppressed.

Advantageous Effects of Invention

According to the one embodiment of the present invention, the baseband amplifier section and the peaking amplifier section are connected in parallel to each other, and the respective drive current setting sections are adjusted to adjust the respective drive current values so that the sum of the drive current value of the baseband amplifier section and the drive current value of the peaking amplifier section may be constant. Consequently, the emphasis circuit, which is capable of obtaining a desired emphasis amount with which the waveform deterioration of the output signal in the high frequency band (high frequency band deterioration) is suppressed without increasing the power consumption (current consumption), may be provided.

BRIEF DESCRIPTION OF DRAWINGS

FIGS. 2A, 2B and 2C are explanatory diagrams for showing frequency response characteristics of the entire emphasis circuit according to the first embodiment of the present invention.

DESCRIPTION OF EMBODIMENTS

Figure 1:
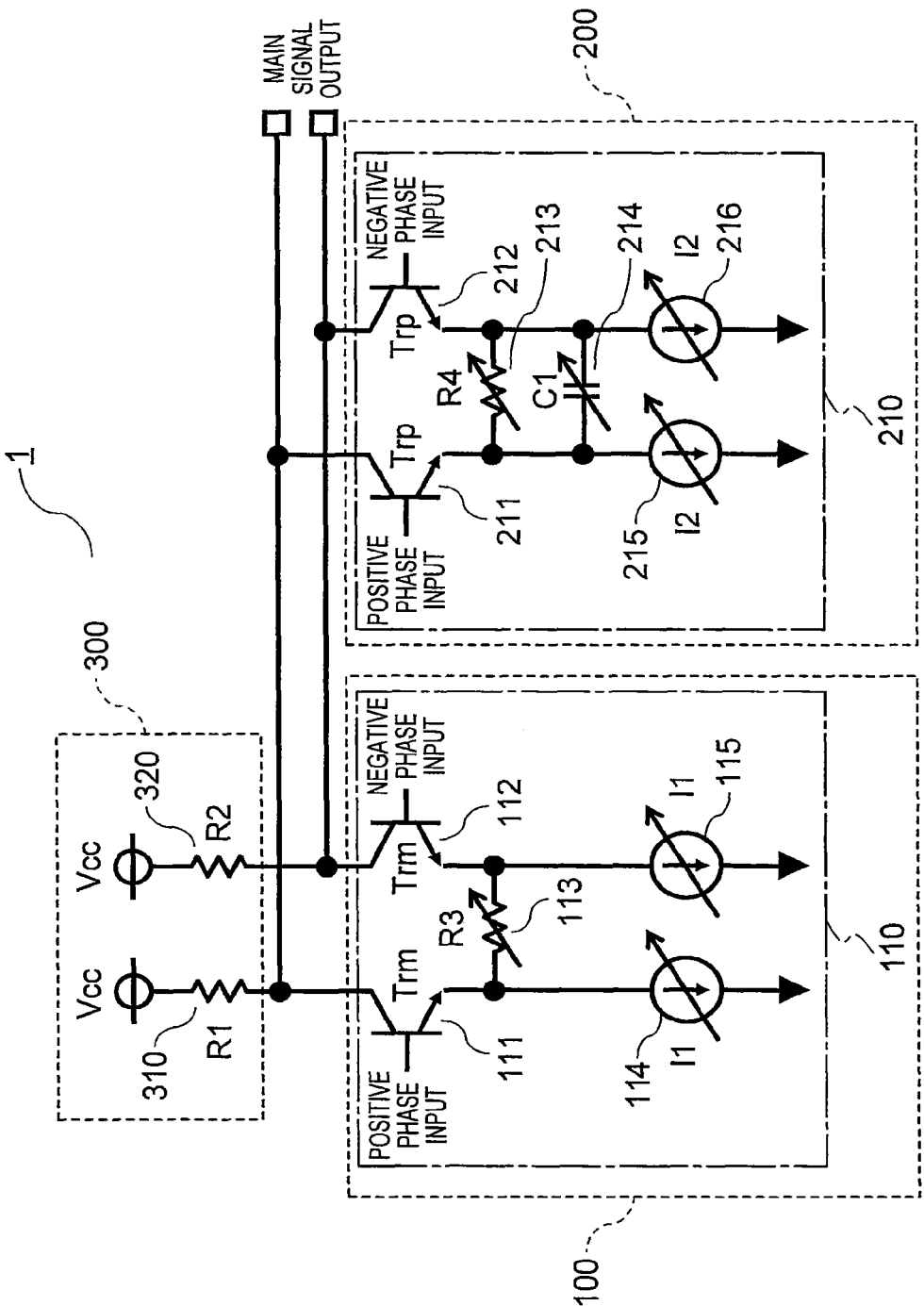
FIG. 1 is a configuration diagram of an emphasis circuit according to a first embodiment of the present invention.

Referring to the accompanying drawings, an emphasis circuit according to exemplary embodiments of the present invention is described below. Note that, in the drawings, the same elements are denoted by the same reference symbols and a redundant description is omitted.

First Embodiment

FIG. 1 is a configuration diagram of an emphasis circuit 1 according to a first embodiment of the present invention. The emphasis circuit 1 of FIG. 1 includes a baseband amplifier section 100, a peaking amplifier section 200, and a signal multiplexing section 300.

The baseband amplifier section 100 includes a baseband amplifier 110 having a differential pair configuration, and the peaking amplifier section 200 includes a peaking amplifier 210 having a differential pair configuration. Further, the signal multiplexing section 300 includes a load resistor 310 (resistance value R1), a load resistor 320 (resistance value R2), and a power supply voltage Vcc. Note that, the configuration of the signal multiplexing section 300 is merely an example, and any configuration may be employed as long as a signal output from the baseband amplifier section 100 and a signal output from the peaking amplifier section 200 are multiplexed and the resultant multiplexed signal, which is a signal having frequency response characteristics that provide a desired gain depending on the frequency, is output as a main signal output.

The baseband amplifier 110 and the peaking amplifier 210 are connected in parallel to each other. One of each differential pair is connected to the power supply voltage Vcc via the load resistor 310, and the other is connected to the power supply voltage Vcc via the load resistor 320. Note that, a case where NPN transistors are used as transistors forming the differential pair is exemplified below.

The baseband amplifier 110 includes transistors 111 and 112, a variable resistor 113 (resistance value R3), and variable current sources 114 and 115 (drive current value I1). Further, a drive current for driving the baseband amplifier 110 flows through the variable current sources 114 and 115. Note that, the variable current sources 114 and 115 correspond to a drive current setting section included in the baseband amplifier section 100, which is capable of adjusting the drive current value I1 that is the magnitude of the drive current for operating the baseband amplifier.

Further, the variable resistor 113 is inserted between emitters of the transistors 111 and 112 as an emitter resistor. The variable current source 114 is connected to the emitter of the transistor 111, and the variable current source 115 is connected to the emitter of the transistor 112.

The peaking amplifier 210 includes transistors 211 and 212, a variable resistor 213 (resistance value R4), a variable capacitor 214 (capacitance value C1), and variable current sources 215 and 216 (drive current value I2). Further, a drive current for driving the peaking amplifier 210 flows through the variable current sources 215 and 216. Note that, the variable current sources 215 and 216 correspond to a drive current setting section included in the peaking amplifier section 200, which is capable of adjusting the drive current value I2 that is the magnitude of the drive current for operating the peaking amplifier.

Further, the variable resistor 213 and the variable capacitor 214 are inserted between emitters of the transistors 211 and 212 so as to be parallel to each other. The variable current source 215 is connected to the emitter of the transistor 211, and the variable current source 216 is connected to the emitter of the transistor 212.

The emphasis circuit 1 inputs differential input signals formed of a positive phase input signal and a negative phase input signal from an amplifier (buffer) (not shown) at a preceding stage. In this case, the positive phase input signal is input to the transistors 111 and 211, and the negative phase input signal is input to the transistors 112 and 212. The load resistor 310 is connected between each collector of the transistors 111 and 211 and the power supply voltage Vcc, and the load resistor 320 is connected between each collector of the transistors 112 and 212 and the power supply voltage Vcc.

Note that, it is preferred that operating characteristics of the transistors 111 and 112 and operating characteristics of the transistors 211 and 212 be the same (Trm=Trp), and the drive current value I1 of the variable current sources 114 and 115 and the drive current value I2 of the variable current sources 215 and 216 be the same (I1=I2), but the present invention is not limited thereto.

Further, the baseband amplifier 110 is not limited to the above-mentioned configuration, and the variable resistor 113 may be a fixed resistor, and further, the variable resistor 113 may be omitted. Similarly, the peaking amplifier 210 is not limited to the above-mentioned configuration, and the variable resistor 213 may be a fixed resistor, and further, the variable capacitor 214 may be a fixed capacitor. Further, an example of the variable resistor 113 and the variable resistor 213 includes a circuit in which a MOSFET is operated in a linear region.

Further, as a configuration example of the baseband amplifier 110, as disclosed in Patent Literature 2, resistors of the same value may be inserted on the emitter side of NPN transistors or on the source side of MOSFETs, and then the baseband amplifier 110 may be driven by a single current source. Similarly, as a configuration example of the peaking amplifier 210, a variable capacitor may be inserted between the emitters, and resistors of the same value may be inserted on the emitter side of NPN transistors or on the source side of MOSFETs, and then the peaking amplifier 210 may be driven by a single current source.

Next, frequency response characteristics of the emphasis circuit 1 according to the first embodiment are described with reference to FIGS. 2A, 2B and 2C. FIGS. 2A, 2B and 2C are explanatory diagrams for showing frequency response characteristics of the entire emphasis circuit according to the first embodiment of the present invention. In this case, frequency response characteristics of the baseband amplifier section 100 are shown in FIG. 2A, frequency response characteristics of the peaking amplifier section 200 are shown in FIG. 2B, and frequency response characteristics of the entire emphasis circuit formed by combining the baseband amplifier section 100 and the peaking amplifier section 200 are shown in FIG. 2C.

As shown in FIG. 2A, in the frequency response characteristics of the baseband amplifier 110, the gain of the baseband amplifier 110 is constant up to near a cutoff frequency fc.

Further, when the drive current value I1 of the baseband amplifier 110 changes, the gain changes over the whole frequency band. Specifically, the characteristics are shifted in the direction of the arrow shown in FIG. 2A (direction in which the gain becomes smaller) along with the decrease in the drive current value I1.

On the other hand, the peaking amplifier 210 is formed by combining the variable resistor 213 and the variable capacitor 214 as described above. Thus, a high frequency component of the current flowing from the collector side of the transistors 211 and 212 to the emitter side thereof flows through the variable capacitor 214. Further, the transistors 211 and 212 operate so as to maintain the voltage value on the emitter side to be the same value over the whole frequency band, and hence the current of the high frequency component increases as compared to the baseband component.

As a result, in the peaking amplifier 210, the frequency response characteristics shown in FIG. 2B are obtained. Further, as shown in FIG. 2B, in the frequency response characteristics of the peaking amplifier 210, the gain near the cutoff frequency fc becomes a peak state as compared to the gains in other frequency bands (the gain peak is obtained near the cutoff frequency fc).

Further, when the drive current value I2 of the peaking amplifier 210 changes, the gain changes over the whole frequency band. Specifically, the characteristics are shifted in the direction of the arrow shown in FIG. 2B (direction in which the gain becomes larger) along with the increase in the drive current value I2.

Then, in the entire emphasis circuit 1, the frequency response characteristics shown in FIG. 2C are obtained. Specifically, a differential input signal amplified by the baseband amplifier 110 and a differential input signal amplified by the peaking amplifier 210 are multiplexed by the load resistor 310 and the load resistor 320, and hence the frequency response characteristics shown in FIG. 2C are obtained.

Further, in the frequency response characteristics, the gain peak is obtained near the cutoff frequency fc, and when the drive current value I2 is zero, the characteristics represented by reference numeral 10 (an emphasis amount is minimum) are obtained. On the other hand, when the drive current value I1 is zero, the characteristics represented by reference numeral 20 (an emphasis amount is maximum) are obtained. Details thereof are described later.

Note that, the emphasis amount as used herein refers to the degree of emphasis of the gain near the cutoff frequency fc, which is determined when the gain peak near the cutoff frequency fc and the gains in other frequency bands are compared. Specifically, in the characteristics represented by reference numeral 10, the gain peak near the cutoff frequency fc is hardly emphasized as compared to the gains in other frequency bands, and hence the degree of emphasis is minimum and the emphasis amount is minimum. On the other hand, in the characteristics represented by reference numeral 20, the gain peak near the cutoff frequency fc is most emphasized as compared to the gains in other frequency bands, and hence the degree of emphasis is maximum and the emphasis amount is maximum.

Note that, the case where the peak frequency at which the gain peak is obtained is matched with the cutoff frequency fc in the frequency response characteristics of the emphasis circuit 1 that provide a desired gain depending on the frequency has been described as an example, but the present invention is not limited thereto. Specifically, the peak frequency may be determined so as to obtain a gain peak corresponding to an optimum frequency band suited to compensation for frequency response characteristics of a channel after the output of the emphasis circuit 1 (at the subsequent stage of the emphasis circuit 1).

Next, the operation of the emphasis circuit 1 according to the first embodiment is described with reference to FIG. 1 and FIGS. 2A, 2B and 2C referred to above. First, differential input signals are input to the baseband amplifier section 100 and the peaking amplifier section 200 from the amplifier (buffer) at the preceding stage at the same timing.

Then, in the emphasis circuit 1 according to the first embodiment, when the drive current value I1 of the baseband amplifier 110 (baseband amplifier section 100) and the drive current value I2 of the peaking amplifier 210 (peaking amplifier section 200) are to be changed, the drive current setting sections are adjusted by an operator. In this manner, a desired emphasis amount with which the high frequency band deterioration is suppressed is obtained. In this case, the drive current value I1 and the drive current value I2 are adjusted so that the sum of the drive current value I1 and the drive current value I2 may always be a constant value C (I1+I2=C).

Specifically, when a desired emphasis amount in the emphasis circuit 1 is minimum, the drive current value I1 is adjusted to be C and the drive current value I2 is adjusted to be zero. In this case, the baseband amplifier 110 operates, but the peaking amplifier 210 does not operate.

As a result, the amplitude of the multiplexed signal (output signal), which is output as a main signal output from the emphasis circuit 1, is amplified based on the characteristics represented by reference numeral 10 of FIG. 2C referred to above. In other words, the amplitude of the output signal is determined only by the product of the drive current value I1 (=C) and each resistance value of the load resistor 310 and the load resistor 320.

Specifically, the output signal is output from the emphasis circuit 1 as a differential signal having the maximum amplitude of I1×R1 or I1×R2. Note that, it is preferred that the resistance value of the load resistor 310 and the resistance value of the load resistor 320 be the same (R1=R2), but the present invention is not limited thereto.

On the other hand, in the channel after the output of the emphasis circuit 1, if the output signal has a large high frequency loss and jitter is superimposed on the waveform of the output signal in the vicinity of a receiver circuit as a subsequent stage of the emphasis circuit 1, the drive current setting sections are adjusted so that the amount of jitter may be decreased (high frequency band deterioration may be suppressed), to thereby obtain a desired emphasis amount.

Specifically, in order to minimize the amount of jitter, the drive current value I1 is adjusted by the variable current sources 114 and 115 so as to be decreased by a predetermined amount, and the drive current value I2 is adjusted so as to be increased by a predetermined amount corresponding to the decrease amount of the drive current value I1.

In this case, in the frequency response characteristics of the emphasis circuit 1, the characteristics represented by reference numeral 10 of FIG. 2C referred to above are shifted in the arrow direction along with the increase in the drive current value I2, and when the drive current value I2 becomes C (the drive current value I1 becomes zero), the characteristics represented by reference numeral 20 are obtained.

In this manner, when the drive current value I1 and the drive current value I2 are adjusted under the state in which the sum of the drive current value I1 and the drive current value I2 is always set to a constant value, the frequency response characteristics (emphasis amount) can be changed. Consequently, a desired emphasis amount with which the amount of jitter is minimized is obtained through the adjustment of the drive current value I1 and the drive current value I2.

Accordingly, at a signal transition point, the amplitude of the output signal is amplified based on the obtained desired emphasis amount. Thus, when the output signal from the emphasis circuit 1 passes through the channel, the amplitude of the output signal at the receiver end after passing through the channel becomes substantially the same as the amplitude of the output signal in the case of consecutive identical digits, and hence the amount of jitter is decreased.

Note that, the signal transmission point as used herein means the timing immediately after the signal has transitioned from the mark side to the space side or the timing immediately after the signal has transitioned from the space side to the mark side.

Further, even when the emphasis amount is changed, the sum of the drive current value I1 and the drive current value I2 is always the same, and hence there is an effect that the power consumption of the entire emphasis circuit is not increased.

Further, the DC voltages on the collector side of the transistors 111, 112, 211, and 212 are equal to each other, and hence there is an effect that the design of the circuit DC operating point is facilitated, and when the emphasis circuit is DC-coupled to a subsequent receiver circuit, there is another effect that the circuit DC operating point with respect to the subsequent receiver circuit is not varied.

As described above, according to the first embodiment, the baseband amplifier and the peaking amplifier are connected in parallel to each other, and the drive current value of the baseband amplifier is adjusted by the corresponding variable current source so as to be decreased by a predetermined amount while the drive current value of the peaking amplifier is adjusted by the corresponding variable current source so as to be increased by a predetermined amount corresponding to the decrease amount of the drive current value of the baseband amplifier so that the sum of the drive current value of the baseband amplifier and the drive current value of the peaking amplifier may be constant. Consequently, a desired emphasis amount with which the high frequency band deterioration of the output signal is suppressed can be obtained without increasing power consumption (current consumption). Further, a linear amplifier is not used as a delay circuit or an output driver, and hence the emphasis function with the suppressed power consumption as compared to the related art is implemented.

Second Embodiment

In the above-mentioned first embodiment, a description has been given of the emphasis circuit 1 including the baseband amplifier section 100 that includes the single baseband amplifier 110 and the peaking amplifier section 200 that includes the single peaking amplifier 210. On the other hand, in a second embodiment of the present invention, a description is given of an emphasis circuit 1a including a baseband amplifier section 100a that includes a plurality of baseband amplifiers and a peaking amplifier section 200a that includes a plurality of peaking amplifiers.

Figure 3:
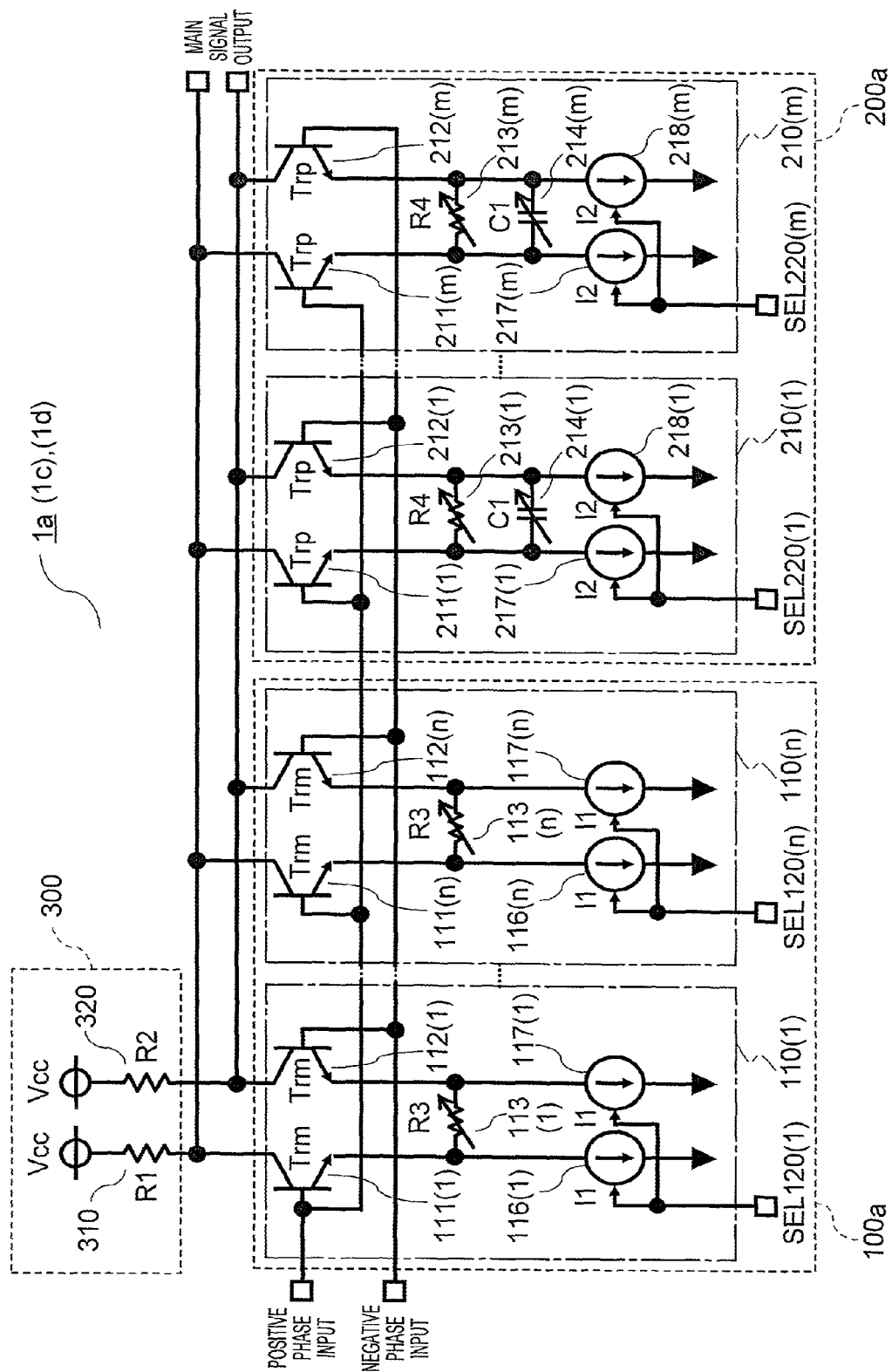
FIG. 3 is a configuration diagram of an emphasis circuit according to a second embodiment of the present invention.

FIG. 3 is a configuration diagram of the emphasis circuit 1a according to the second embodiment of the present invention. The emphasis circuit 1a of FIG. 3 includes the baseband amplifier section 100a, the peaking amplifier section 200a, and a signal multiplexing section 300 including a load resistor 310, a load resistor 320, and a power supply voltage Vcc.

The baseband amplifier section 100a includes n baseband amplifiers 110(1) to 110(n), and n switching sections 120(1) to 120(n) corresponding to the respective baseband amplifiers. The peaking amplifier section 200a includes m peaking amplifiers 210(1) to 210(m), and m switching sections 220(1) to 220(m) corresponding to the respective peaking amplifiers. Note that, similarly to the above-mentioned first embodiment, those baseband amplifiers and peaking amplifiers each have a differential pair configuration, and n and m are natural numbers of 2 or more.

Further, the baseband amplifiers 110(1) to 110(n) and the peaking amplifiers 210(1) to 210(m) are connected in parallel to each other. One of each differential pair is connected to the power supply voltage Vcc via the load resistor 310, and the other is connected to the power supply voltage Vcc via the load resistor 320.

Note that, in the following, the configuration of the baseband amplifier 110(1) is mainly described because the baseband amplifiers 110(1) to 110(n) have the same configuration, and the configuration of the peaking amplifier 210(1) is mainly described because the peaking amplifiers 210(1) to 210(m) have the same configuration.

The baseband amplifier 110(1) includes transistors 111(1) and 112(1), a variable resistor 113(1), and constant current sources 116(1) and 117(1). Note that, in the constant current sources 116(1) and 117(1), the drive current value I1 is not variable but constant unlike the above-mentioned first embodiment.

Further, the variable resistor 113(1) is inserted between emitters of the transistors 111(1) and 112(1) as an emitter resistor. The constant current source 116(1) is connected to the emitter of the transistor 111(1), and the constant current source 117(1) is connected to the emitter of the transistor 112(1).

Further, the constant current sources 116(1) and 117(1) are switched between the On state and the Off state by the switching section 120(1). In this case, when the constant current sources 116(1) and 117(1) are in the On state, the drive current flows and the baseband amplifier 110(1) operates, but when the constant current sources 116(1) and 117(1) are in the Off state, no drive current flows and the baseband amplifier 110(1) does not operate.

The peaking amplifier 210(1) includes transistors 211(1) and 212(1), a variable resistor 213(1), a variable capacitor 214(1), and constant current sources 217(1) and 218(1). Note that, in the constant current sources 217(1) and 218(1), the drive current value I2 is not variable but constant unlike the above-mentioned first embodiment.

Further, the variable resistor 213(1) and the variable capacitor 214(1) are inserted between emitters of the transistors 211(1) and 212(1) so as to be parallel to each other. The constant current source 217(1) is connected to the emitter of the transistor 211(1), and the constant current source 218(1) is connected to the emitter of the transistor 212(1).

Further, the constant current sources 217(1) and 218(1) are switched between the On state and the Off state by the switching section 220(1). In this case, when the constant current sources 217(1) and 218(1) are in the On state, the drive current flows and the peaking amplifier 210(1) operates, but when the constant current sources 217(1) and 218(1) are in the Off state, no drive current flows and the peaking amplifier 210(1) does not operate.

In this manner, the number of operating amplifiers in the baseband amplifier section 100a is changed by a first switching section (corresponding to the switching sections 120(1) to 120($n$)), which is capable of switching the On/Off state of the respective constant current sources corresponding to the baseband amplifiers included in the baseband amplifier section 100a. Similarly, the number of operating amplifiers in the peaking amplifier section 200a is changed by a second switching section (corresponding to the switching sections 220(1) to 220($m$)), which is capable of switching the On/Off state of the respective constant current sources corresponding to the peaking amplifiers included in the peaking amplifier section 200a.

Then, when the number of operating amplifiers in the baseband amplifier section 100a is changed, the sum of the drive current values I1 that flow through the respective constant current sources corresponding to the baseband amplifiers, that is, the drive current value of the baseband amplifier section 100a is changed. Similarly, when the number of operating amplifiers in the peaking amplifier section 200a is changed, the sum of the drive current values I2 that flow through the respective constant current sources corresponding to the peaking amplifiers, that is, the drive current value of the peaking amplifier section 200a is changed.

Note that, the first switching section corresponds to a drive current setting section capable of adjusting the drive current value for operating the baseband amplifier section 100a. Further, the second switching section corresponds to a drive current setting section capable of adjusting the drive current value for operating the peaking amplifier section 200a.

The emphasis circuit 1a inputs differential input signals from an amplifier (buffer) (not shown) at a preceding stage. In this case, the positive phase input signal of the differential input signals is input to the transistors 111(1) to 111($n$) and 211(1) to 211($m$), and the negative phase input signal of the differential input signals is input to the transistors 112(1) to 112($n$) and 212(1) to 212($m$).

The load resistor 310 is connected between each collector of the transistors 111(1) to 111($n$) and 211(1) to 211($m$) and the power supply voltage Vcc, and the load resistor 320 is connected between each collector of the transistors 112(1) to 112($n$) and 212(1) to 212($m$) and the power supply voltage Vcc.

Note that, it is preferred that operating characteristics of the transistors 111(1) to 111($n$) and 112(1) to 112($n$) and operating characteristics of the transistors 211(1) to 211($m$) and 212(1) to 212($m$) be the same (Trm=Trp). Further, it is preferred that the drive current value I1 of the constant current sources 116(1) to 116($n$) and 117(1) to 117($n$) and the drive current value I2 of the constant current sources 217(1) to 217($m$) and 218(1) to 218($m$) be the same (I1=I2). However, the present invention is not limited thereto.

Further, the baseband amplifiers 110(1) to 110($n$) are not limited to the above-mentioned configuration, and the variable resistors 113(1) to 113($n$) may be fixed resistors, and further, the variable resistors 113(1) to 113($n$) may be omitted. Similarly, the peaking amplifiers 210(1) to 210($m$) are not limited to the above-mentioned configuration, and the variable resistors 213(1) to 213($m$) may be fixed resistors, and further, the variable capacitors 214(1) to 214($m$) may be fixed capacitors. Further, an example of the variable resistors 113(1) to 113($n$) and the variable resistors 213(1) to 213($m$) includes a circuit in which a MOSFET is operated in a linear region.

Further, as a configuration example of the baseband amplifiers 110(1) to 110($n$), as disclosed in Patent Literature 2, resistors of the same value may be inserted on the emitter side of NPN transistors or on the source side of MOSFETs, and then the baseband amplifier may be driven by a single current source. Similarly, as a configuration example of the peaking amplifiers 210(1) to 210($m$), a variable capacitor may be inserted between the emitters, and resistors of the same value may be inserted on the emitter side of NPN transistors or on the source side of MOSFETs, and then the peaking amplifier may be driven by a single current source.

Next, the operation of the emphasis circuit 1a according to the second embodiment is described with reference to FIG. 3 referred to above. First, similarly to the above-mentioned first embodiment, differential input signals are input to the baseband amplifier section 100a and the peaking amplifier section 200a from the amplifier (buffer) at the preceding stage at the same timing.

Then, in the emphasis circuit 1a according to the second embodiment, when the number of operating amplifiers in the baseband amplifier section 100a and the number of operating amplifiers in the peaking amplifier section 200a are to be changed, similarly to the above-mentioned first embodiment, the drive current setting sections are adjusted by an operator. Specifically, the respective numbers of operating amplifiers are changed through the switching between the On state and the Off state by the switching sections 120(1) to 120($n$) included in the first switching section and the switching sections 220(1) to 220($m$) included in the second switching section.

In this manner, when the respective numbers of operating amplifiers are changed, the drive current values of the baseband amplifier section 100a and the peaking amplifier section 200a are changed, and hence a desired emphasis amount with which the high frequency band deterioration is suppressed is obtained. In this case, the drive current value of the baseband amplifier section 100a and the drive current value of the peaking amplifier section 200a are adjusted so that the sum of the drive current values may always be a constant value. In other words, the respective numbers of operating amplifiers are adjusted so that the sum of the sum of the drive current values I1 that flow through the respective constant current sources in the On state in the baseband amplifier section 100a and the sum of the drive current values I2 that flow through the respective constant current sources in the On state in the peaking amplifier section 200a may be equal before and after the adjustment of the respective numbers of operating amplifiers.

Specifically, when a desired emphasis amount in the emphasis circuit 1a is minimum, the constant current sources 116(1) to 116(n) and 117(1) to 117(n) are in the On state by the switching sections 120(1) to 120(n). On the other hand, the constant current sources 217(1) to 217(m) and 218(1) to 218(m) are in the Off state by the switching sections 220(1) to 220(m). In this case, the number of operating amplifiers in the baseband amplifier section 100a is n, and the number of operating amplifiers in the peaking amplifier section 200a is zero.

As a result, the amplitude of the multiplexed signal (output signal), which is output from the emphasis circuit 1a as a main signal output, is amplified based on the same characteristics as in the above-mentioned first embodiment. Specifically, the amplitude of the output signal is determined only by the product of the drive current value I1×n, which is the sum of the drive current values I1 of the baseband amplifiers 110(1) to 110(n), and each resistance value of the load resistor 310 and the load resistor 320.

Specifically, the output signal is output from the emphasis circuit 1a as a differential signal having the maximum amplitude of I1×n×R1 or I1×n×R2. Note that, it is preferred that the resistance value of the load resistor 310 and the resistance value of the load resistor 320 be the same (R1=R2), but the present invention is not limited thereto.

On the other hand, in the channel after the output of the emphasis circuit 1a, if the output signal has a large high frequency loss and jitter is superimposed on the waveform of the output signal in the vicinity of a receiver circuit as a subsequent stage of the emphasis circuit 1a, the drive current setting sections are adjusted so that the amount of jitter may be decreased (high frequency band deterioration may be suppressed), to thereby obtain a desired emphasis amount.

Specifically, in order to minimize the amount of jitter, the number of operating amplifiers in the baseband amplifier section 100a is adjusted to be decreased by a predetermined number through the switching between the On state and the Off state of the constant current sources 116(1) to 116(n) and 117(1) to 117(n) by the switching sections 120(1) to 120(n). At the same time, the number of operating amplifiers in the peaking amplifier section 200a is adjusted to be increased by a predetermined number through the switching between the On state and the Off state of the constant current sources 217(1) to 217(m) and 218(1) to 218(m) by the switching sections 220(1) to 220(m).

Specifically, the numbers of operating amplifiers are adjusted so that the sum of the sum of the drive current values I1 that flow through the respective constant current sources in the On state in the baseband amplifier section 100a and the sum of the drive current values I2 that flow through the respective constant current sources in the On state in the peaking amplifier section 200a may be equal before and after the adjustment of the numbers of operating amplifiers. In this case, the frequency response characteristics of the emphasis circuit 1a show the same characteristics as in the above-mentioned first embodiment along with the increase in the number of operating amplifiers in the peaking amplifier section 200a. Note that, when I1=I2 is set, the increased number of operating amplifiers in the peaking amplifier section 200a and the decreased number of operating amplifiers in the baseband amplifier section 100a are equal to each other.

In this manner, when the number of operating amplifiers in the baseband amplifier section 100a and the number of operating amplifiers in the peaking amplifier section 200a are adjusted, the frequency response characteristics (emphasis amount) can be changed similarly to the above-mentioned first embodiment. Consequently, when the numbers of operating amplifiers are adjusted, a desired emphasis amount with which the amount of jitter is minimized is obtained similarly to the above-mentioned first embodiment.

Accordingly, at a signal transition point, the amplitude of the output signal is amplified based on the obtained desired emphasis amount. Thus, when the output signal from the emphasis circuit 1a passes through the channel, the amplitude of the output signal at the receiver end after passing through the channel becomes substantially the same as the amplitude of the output signal in the case of consecutive identical digits, and hence the amount of jitter is decreased.

Further, even when the emphasis amount is changed, the sum of the sum of the drive current values I1 that flow through the respective constant current sources in the On state in the baseband amplifier section 100a and the sum of the drive current values I2 that flow through the respective constant current sources in the On state of the peaking amplifier section 200a are always equal before and after the change, and hence there is an effect that the power consumption of the entire emphasis circuit is not increased.

Further, the emphasis amount can be determined merely by switching each constant current source to the On state or the Off state by each switching section without changing the drive current value, and hence there is an effect that the emphasis amount can be easily changed as compared to the above-mentioned first embodiment Further, when I1=I2 is set, the current flowing through each differential pair in the baseband amplifier section 100a and the peaking amplifier section 200a is constant regardless of the emphasis amount, and hence there is an effect that various characteristics such as the DC gain and high frequency characteristics are stabilized.

Further, the DC voltages on the collector side of the NPN transistors in the baseband amplifier section 100a and the peaking amplifier section 200a are equal to each other, and hence there is an effect that the design of the circuit DC operating point is facilitated, and when the emphasis circuit is DC-coupled to a subsequent receiver circuit, there is another effect that the circuit DC operating point with respect to the subsequent receiver circuit is not varied.

Figure 4A:
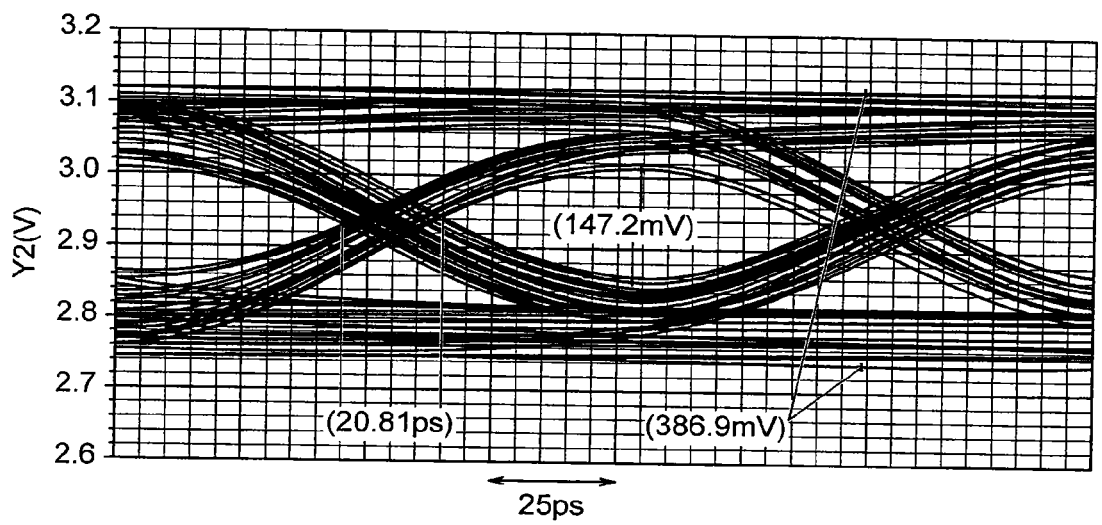
FIGS. 4A and 4B are explanatory diagrams for showing an example of simulated eye pattern waveforms obtained by an operation of the emphasis circuit according to the second embodiment of the present invention.
Figure 4B:
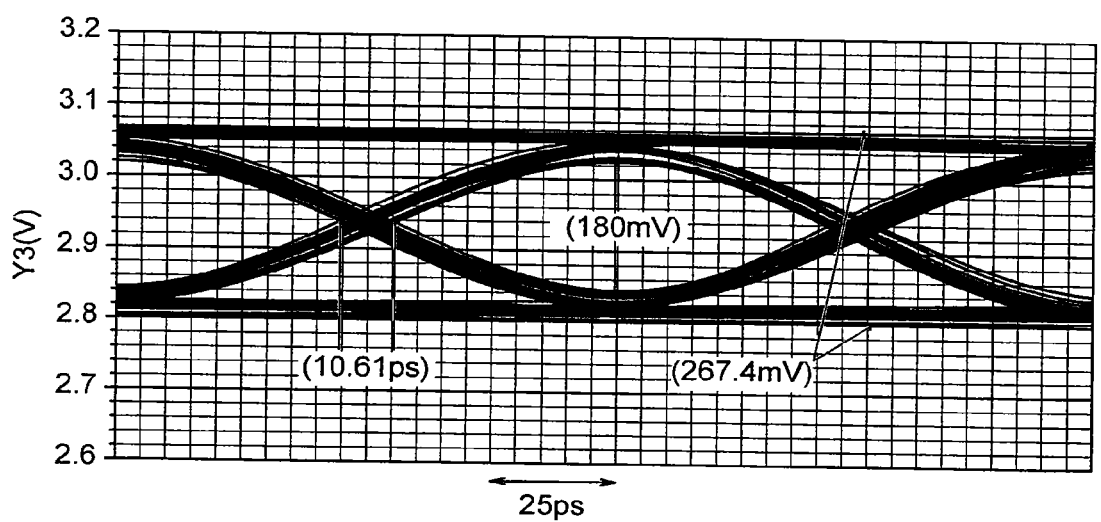

Next, an example of the specific operation of the emphasis circuit 1a according to the second embodiment is described with reference to FIGS. 4A and 4B. FIGS. 4A and 4B are explanatory diagrams for showing an example of simulated eye pattern waveforms obtained by the operation of the emphasis circuit 1a according to the second embodiment of the present invention. In this case, a simulated eye pattern waveform obtained when the number of operating amplifiers in the peaking amplifier section 200a is not optimized is shown in FIG. 4A, and a simulated eye pattern waveform obtained when the number of operating amplifiers in the peaking amplifier section 200a is optimized is shown in FIG. 4B.

Note that, in this case, a channel model having a loss of a high frequency signal component is arranged at an output section of the emphasis circuit 1a, and the case where a PRBS-7 signal at 10.3125 Gb/s is input as a signal input to the emphasis circuit 1a is exemplified.

Now, a case is assumed in which the constant current sources of the baseband amplifiers 110(1) to 110(n) are all brought into the On state by the respective switching sections, and the constant current sources of the peaking amplifiers 210(1) to 210(m) are all brought into the Off state by the respective switching sections. Specifically, the number of operating amplifiers in the baseband amplifier section 100a is n, and the number of operating amplifiers in the peaking amplifier section 200a is zero. In the case where the number of operating amplifiers in the peaking amplifier section 200a is not optimized as described above, the simulated eye pattern waveform shown in FIG. 4A is obtained at the receiving end.

Then, as understood from FIG. 4A, when the output signal from the emphasis circuit 1a passes through the channel, the amplitude of a high frequency signal component thereof is decreased so that the amount of jitter is increased at the receiving end, with the result that the amount of jitter at a cross point is 20.81 ps. Because the amount of jitter is increased in this manner, an error may occur at the receiving end.

On the other hand, as described above, when the drive current setting sections are adjusted so that the amount of jitter may be decreased (high frequency band deterioration may be suppressed), a desired emphasis amount with which the amount of jitter is minimized is obtained. In this manner, when the number of operating amplifiers in the peaking amplifier section 200a is optimized, the simulated eye pattern waveform shown in FIG. 4B is obtained at the receiving end.

As understood from FIG. 4B, when the number of operating amplifiers in the peaking amplifier section 200a is optimized, the amount of jitter at the cross point is 10.61 ps. In this manner, when the number of operating amplifiers in the peaking amplifier section 200a is optimized, the amount of jitter is decreased, with the result that the error probability at the receiving end can be reduced.

As described above, according to the second embodiment, the numbers of operating amplifiers in the baseband amplifier section and the peaking amplifier section are adjusted by the respective switching sections so that the sum of the sum of the drive current values that flow through the constant current sources in the On state in the baseband amplifier section and the sum of the drive current values that flow through the constant current sources in the On state in the peaking amplifier section may be equal before and after the adjustment of the numbers of operating amplifiers. Consequently, a desired emphasis amount with which the high frequency band deterioration of the output signal is suppressed can be obtained without increasing power consumption (current consumption).

Third Embodiment

In the above-mentioned second embodiment, a description has been given of the emphasis circuit 1a including the baseband amplifier section 100a that includes the n baseband amplifiers and the peaking amplifier section 200a that includes the m peaking amplifiers. On the other hand, in a third embodiment of the present invention, a description is given of an emphasis circuit 1b including a baseband amplifier section 100b that further includes a fixed baseband amplifier 110N.

Figure 5:
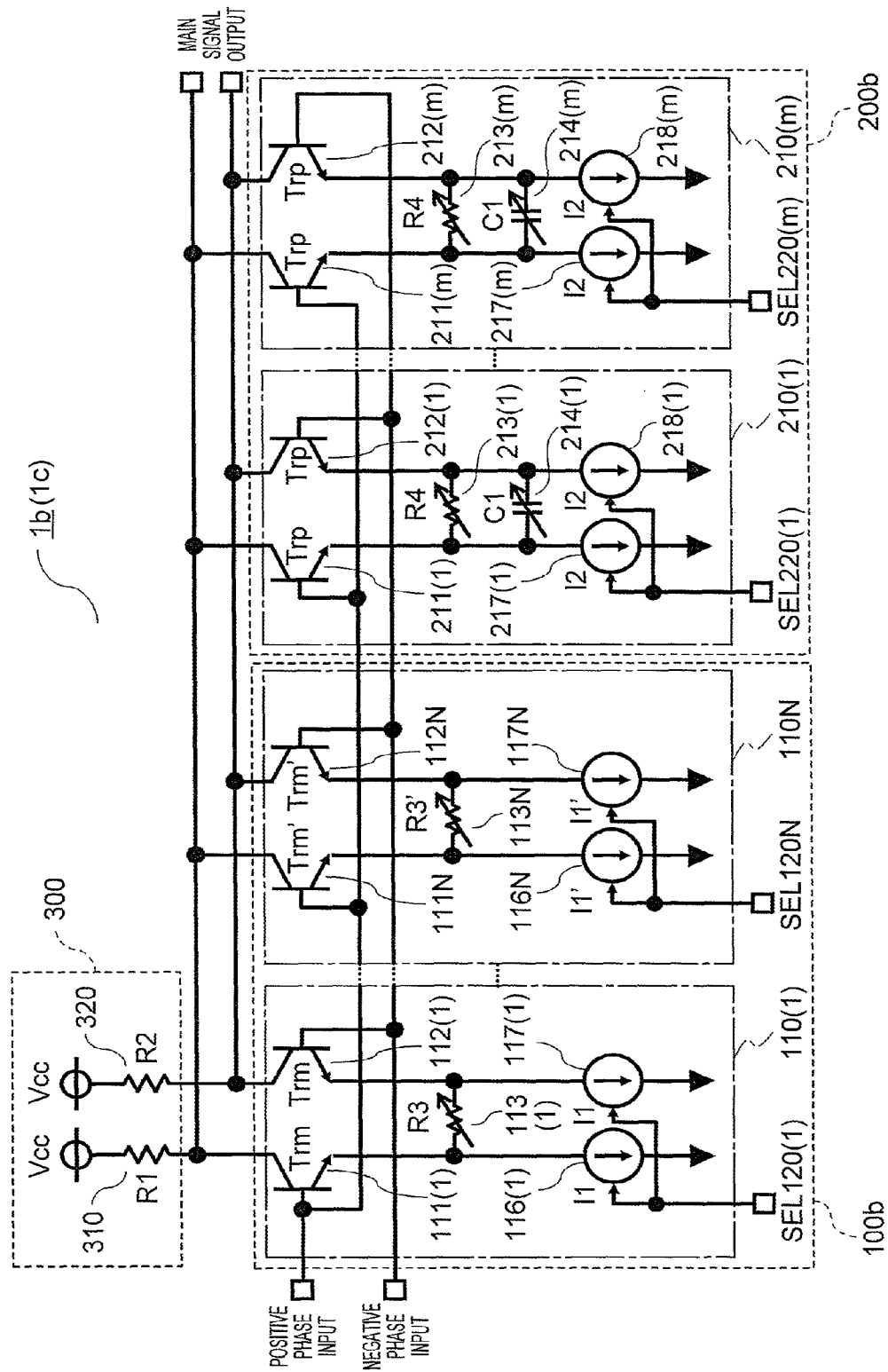
FIG. 5 is a configuration diagram of an emphasis circuit according to a third embodiment of the present invention.

FIG. 5 is a configuration diagram of the emphasis circuit 1b according to the third embodiment of the present invention. The emphasis circuit 1b of FIG. 5 includes the baseband amplifier section 100b, a peaking amplifier section 200b, and a signal multiplexing section 300 including a load resistor 310, a load resistor 320, and a power supply voltage Vcc.

The baseband amplifier section 100b further includes, in addition to the same configuration as in the baseband amplifier section 100a, the fixed baseband amplifier 110N and a switching section 120N corresponding to this baseband amplifier. The peaking amplifier section 200b has the same configuration as in the peaking amplifier section 200a. Note that, the fixed baseband amplifier 110N has a differential pair configuration similarly to the above-mentioned second embodiment, and n and m are natural numbers of 2 or more.

Further, the fixed baseband amplifier 110N is connected in parallel to the other baseband amplifiers. One of the differential pair of the fixed baseband amplifier 110N is connected to the power supply voltage Vcc via the load resistor 310, and the other is connected to the power supply voltage Vcc via the load resistor 320.

The fixed baseband amplifier 110N includes transistors 111N and 112N, a variable resistor 113N (resistance value R3'), and constant current sources 116N and 117N (drive current value I1'). Note that, in the constant current sources 116N and 117N, the drive current value I1' is not variable but constant as in the above-mentioned second embodiment.

Further, the variable resistor 113N is inserted between emitters of the transistors 111N and 112N as an emitter resistor. The constant current source 116N is connected to the emitter of the transistor 111N, and the constant current source 117N is connected to the emitter of the transistor 112N.

Further, the constant current sources 116N and 117N are switched between the On state and the Off state by the switching section 120N. In this case, when the constant current sources 116N and 117N are in the On state, the drive current flows and the fixed baseband amplifier 110N operates, but when the constant current sources 116N and 117N are in the Off state, no drive current flows and the fixed baseband amplifier 110N does not operate.

The emphasis circuit 1b inputs differential input signals from an amplifier (buffer) (not shown) at a preceding stage. In this case, the positive phase input signal of the differential input signals is input to the transistors 111(1) to 111(n), 111N, and 211(1) to 211(m), and the negative phase input signal of the differential input signals is input to the transistors 112(1) to 112(n), 112N, and 212(1) to 212(m).

The load resistor 310 is connected between each collector of the transistors 111(1) to 111(n), 111N, and 211(1) to 211(m) and the power supply voltage Vcc, and the load resistor 320 is connected between each collector of the transistors 112(1) to 112(n), 112N, and 212(1) to 212(m) and the power supply voltage Vcc.

Note that, it is preferred that operating characteristics of the transistors 111(1) to 111(n) and 112(1) to 112(n) and operating characteristics of the transistors 211(1) to 211(m) and 212(1) to 212(m) be the same (Trm=Trp). Further, it is preferred that the drive current value I1 of the constant current sources 116(1) to 116(n) and 117(1) to 117(n) and the drive current value I2 of the constant current sources 217(1)

to 217(*m*) and 218(1) to 218(*m*) be the same (I1=I2). However, the present invention is not limited thereto.

Further, in the third embodiment, the case where the number of fixed baseband amplifiers 110N is one has been exemplified, but the present invention is not limited thereto, and a plurality of fixed baseband amplifiers 110N may be arranged in parallel.

Further, the baseband amplifiers 110(1) to 110(*n*) and the fixed baseband amplifier 110N are not limited to the above-mentioned configuration, and the variable resistors 113(1) to 113(*n*) and 113N may be fixed resistors, and further, the variable resistors 113(1) to 113(*n*) and 113N may be omitted. Similarly, the peaking amplifiers 210(1) to 210(*m*) are not limited to the above-mentioned configuration, and the variable resistors 213(1) to 213(*m*) may be fixed resistors, and further, the variable capacitors 214(1) to 214(*m*) may be fixed capacitors.

Further, as a configuration example of the baseband amplifiers 110(1) to 110(*n*) and the fixed baseband amplifier 110N, as disclosed in Patent Literature 2, resistors of the same value may be inserted on the emitter side of NPN transistors or on the source side of MOSFETs, and then the baseband amplifier may be driven by a single current source. Similarly, as a configuration example of the peaking amplifiers 210(1) to 210(*m*), a variable capacitor may be inserted between the emitters, and resistors of the same value may be inserted on the emitter side of NPN transistors or on the source side of MOSFETs, and then the peaking amplifier may be driven by a single current source.

Next, the operation of the emphasis circuit 1*b* according to the third embodiment is described with reference to FIG. 5 referred to above. First, similarly to the above-mentioned second embodiment, differential input signals are input to the baseband amplifier section 100*b* and the peaking amplifier section 200*b* from the amplifier (buffer) at the preceding stage at the same timing.

Then, in the emphasis circuit 1*b* according to the third embodiment, when the number of operating amplifiers in the baseband amplifier section 100*b* and the number of operating amplifiers in the peaking amplifier section 200*b* are to be changed, similarly to the above-mentioned second embodiment, the drive current setting sections are adjusted by an operator. Specifically, the respective numbers of operating amplifiers are changed through the switching between the On state and the Off state by the switching sections 120(1) to 120(*n*) included in the first switching section and the switching sections 220(1) to 220(*m*) included in the second switching section.

Further, in this case, the constant current sources 116N and 117N are always in the On state by the switching section 120N, and hence the fixed baseband amplifier 110N always operates. As described above, the fixed baseband amplifier 110N always operates even when the respective numbers of operating amplifiers are changed, and hence the switching section 120N may be omitted.

In this case, in general, it is preferred to set the drive current value I1' to be larger than the drive current value I1. When the drive current value I1' is set in this manner, the fixed baseband amplifier 110N always operates, and hence there is an effect that n can be decreased as compared to the above-mentioned second embodiment.

Specifically, the drive current value of the fixed baseband amplifier 110N is always secured for the drive current value of the baseband amplifier section 100*b*, and hence the number of baseband amplifiers 110(1) to 110(*n*) can be decreased correspondingly to the drive current value of the fixed baseband amplifier 110N as compared to the above-mentioned second embodiment. Further, similarly to the above-mentioned second embodiment, the number of operating amplifiers in the baseband amplifier section 100*a* is adjusted so as to be decreased by a predetermined number, and the number of operating amplifiers in the peaking amplifier section 200*a* is adjusted so as to be increased by a predetermined number.

Then, when the numbers of operating amplifiers are adjusted, similarly to the above-mentioned second embodiment, a desired emphasis amount with which the amount of jitter is minimized is obtained. Consequently, there is an effect that even when the emphasis amount is changed, the power consumption of the entire emphasis circuit is not increased, similarly to the above-mentioned second embodiment.

As described above, according to the third embodiment, even when the respective numbers of operating amplifiers are changed, the fixed baseband amplifier that always operates is further included in the baseband amplifier section including the n baseband amplifiers. Consequently, the necessary number of amplifiers in the baseband amplifier section can be decreased as compared to the above-mentioned second embodiment.

Fourth Embodiment

In the above-mentioned second and third embodiments, a description has been given of the case where the drive current source for driving each amplifier included in the baseband amplifier sections 100*a* and 100*b* and the peaking amplifier sections 200*a* and 200*b* is a constant current source. On the other hand, in a fourth embodiment of the present invention, a description is given of a case where the drive current source for driving each amplifier is a variable current source rather than a constant current source.

An emphasis circuit 1*c* according to the fourth embodiment is formed of variable current sources instead of the constant current sources of the emphasis circuits 1*a* and 1*b* (see FIG. 3 and FIG. 5 referred to above) according to the above-mentioned second and third embodiments. Note that, each switching section is eliminated, and n and m are natural numbers of 2 or more.

Note that, it is preferred that operating characteristics of the transistors 111(1) to 111(*n*) and 112(1) to 112(*n*) and operating characteristics of the transistors 211(1) to 211(*m*) and 212(1) to 212(*m*) be the same (Trm=Trp). Further, it is preferred that the drive current value I1 of the constant current sources 116(1) to 116(*n*) and 117(1) to 117(*n*) and the drive current value I2 of the constant current sources 217(1) to 217(*m*) and 218(1) to 218(*m*) be the same (I1=I2). However, the present invention is not limited thereto.

Further, the baseband amplifiers 110(1) to 110(*n*) are not limited to the above-mentioned configuration, and the variable resistors 113(1) to 113(*n*) may be fixed resistors, and further, the variable resistors 113(1) to 113(*n*) may be omitted. Similarly, the peaking amplifiers 210(1) to 210(*m*) are not limited to the above-mentioned configuration, and the variable resistors 213(1) to 213(*m*) may be fixed resistors, and further, the variable capacitors 214(1) to 214(*m*) may be fixed capacitors.

Further, as a configuration example of the baseband amplifiers 110(1) to 110(*n*), as disclosed in Patent Literature 2, resistors of the same value may be inserted on the emitter side of NPN transistors or on the source side of MOSFETs, and then the baseband amplifier may be driven by a single current source. Similarly, as a configuration example of the peaking amplifiers 210(1) to 210(*m*), a variable capacitor may be inserted between the emitters, and resistors of the same value may be inserted on the emitter side of NPN transistors or on the source side of MOSFETs, and then the peaking amplifier may be driven by a single current source.

Next, the operation of the emphasis circuit 1c according to the fourth embodiment is described. First, similarly to the above-mentioned second and third embodiments, differential input signals are input to the baseband amplifier section 100c and the peaking amplifier section 200c from the amplifier (buffer) at the preceding stage at the same timing.

In this case, in the emphasis circuit 1c according to the fourth embodiment, the drive current source is a variable current source rather than a constant current source, and hence when the drive current setting sections are adjusted similarly to the above-mentioned second and third embodiments, the drive current values I1 and I2 can be changed as necessary.

Consequently, unlike the above-mentioned second and third embodiments in which the constant current source having a predefined drive current value is used, the drive current value can be changed as appropriate, and hence when the drive current setting sections are adjusted in order to obtain a desired emphasis amount, finer adjustment can be performed.

As described above, according to the fourth embodiment, the variable current source rather than the constant current source is used as the drive current source for driving each amplifier in the baseband amplifier section 100b and the peaking amplifier section 200b. Consequently, the drive current value for each amplifier is changed as appropriate, and hence when the drive current setting sections are adjusted in order to obtain a desired emphasis amount, finer adjustment can be performed.

Fifth Embodiment

In the above-mentioned second embodiment, a description has been given of the case where the amplifiers in the baseband amplifier section 100a have the same configuration and the amplifiers in the peaking amplifier section 200a have the same configuration. On the other hand, in a fifth embodiment of the present invention, a description is given of a case where amplifiers in a baseband amplifier section 100d and amplifiers in a peaking amplifier section 200d have different characteristics (for example, a drive current value, a transistor size, and the like).

In an emphasis circuit 1d according to the fifth embodiment, unlike the emphasis circuit 1a (see FIG. 3 referred to above) according to the above-mentioned second embodiment, the baseband amplifiers 110(1) to 110(n) are set to have different characteristics (specifically, transistor characteristics, the resistance value R3 of the variable resistor, the drive current value I1 of the constant current source, and the like). Similarly, the peaking amplifiers 210(1) to 210(m) are also set to have different characteristics (specifically, transistor characteristics, the resistance value R4 of the variable resistor, the capacitance value C1 of the variable capacitor, the drive current value I2 of the constant current source, and the like). Note that, n and m are natural numbers of 2 or more.

Further, a plurality of combinations are defined, each of which has one drive current value I1 among the baseband amplifiers 110(1) to 110(n) and one drive current value I2 among the peaking amplifiers 210(1) to 210(m). Then, the drive current values I1 and I2 for the respective amplifiers are changed for every combination so that the total drive current value (I1+I2) may always be the same. Because the amplifiers have different characteristics as described above, each of the drive current values I1 and I2 for the respective amplifiers can be changed to define the combinations.

Specifically, for example, it is assumed that n=m is established and x is a natural number of 2 or more and n or less or m or less. In this case, each of the drive current values I1 and I2 for the respective amplifiers is changed to define the combinations so that the total drive current value of the drive current value I1 for the x-th baseband amplifier 110(x) and the drive current value I2 for the x-th peaking amplifier 210(x) may be the same for every combination. Note that, such a combination is not applied to the drive current value I1 for the first baseband amplifier 110(1) and the drive current value I2 for the first peaking amplifier.

More specifically, for example, it is assumed that n=m=4 is established and x is a natural number of 2 or more and 4 or less. In this case, for example, when the total drive current value is 4 A, the following combinations are given as examples of the combinations. Specifically, a combination corresponding to the second amplifiers is (I1, I2)=(1, 3), a combination corresponding to the third amplifiers is (I1, I2)=(2, 2), and a combination corresponding to the fourth amplifiers is (I1, I2)=(3, 1). Then, the drive current value I1 for the first baseband amplifier 110(1) and the drive current value I2 for the first peaking amplifier are each 4 A.

Further, the baseband amplifiers 110(1) to 110(n) are not limited to the above-mentioned configuration, and the variable resistors 113(1) to 113(n) may be fixed resistors, and further, the variable resistors 113(1) to 113(n) may be omitted. Similarly, the peaking amplifiers 210(1) to 210(m) are not limited to the above-mentioned configuration, and the variable resistors 213(1) to 213(m) may be fixed resistors, and further, the variable capacitors 214(1) to 214(m) may be fixed capacitors.

Further, as a configuration example of the baseband amplifiers 110(1) to 110(n), as disclosed in Patent Literature 2, resistors of the same value may be inserted on the emitter side of NPN transistors or on the source side of MOSFETs, and then the baseband amplifier may be driven by a single current source. Similarly, as a configuration example of the peaking amplifiers 210(1) to 210(m), a variable capacitor may be inserted between the emitters, and resistors of the same value may be inserted on the emitter side of NPN transistors or on the source side of MOSFETs, and then the peaking amplifier may be driven by a single current source.

Next, the operation of the emphasis circuit 1d according to the fifth embodiment is described. First, similarly to the above-mentioned second embodiment, differential input signals are input to the baseband amplifier section 100d and the peaking amplifier section 200d from the amplifier (buffer) at the preceding stage at the same timing.

In this case, in the emphasis circuit 1d according to the fifth embodiment, when the drive current setting sections are adjusted similarly to the above-mentioned second embodiment, any one of the first baseband amplifier 110(1), the x-th baseband amplifier 110(x) and the x-th peaking amplifier 210(x) corresponding to each defined combination, and the first peaking amplifier 210(1) is selected to operate.

Specifically, when a desired emphasis amount in the emphasis circuit 1d is minimum, the constant current sources 116(1) and 117(1) are in the On state by the switching sections. On the other hand, the other constant current sources are in the Off state by the switching sections. In this case, the number of operating amplifiers in the baseband amplifier section 100d is one, and the number of operating amplifiers in the peaking amplifier section 200d is zero.

Then, when a desired emphasis amount in the emphasis circuit 1d is to be changed, any one of the defined combinations is selected by the switching sections. In this case, the constant current sources for the baseband amplifier and the peaking amplifier corresponding to the selected combination are brought into the On state, and the other constant current sources are brought into the Off state. In this case, the number of operating amplifiers in the baseband amplifier section 100d is one, and the number of operating amplifiers in the peaking amplifier section 200d is one.

In addition, when a desired emphasis amount in the emphasis circuit 1d is maximum, the constant current sources 217(1) and 218(1) are in the On state by the respective switching sections. On the other hand, the other constant current sources are in the Off state by the respective switching sections. In this case, the number of operating amplifiers in the baseband amplifier section 100d is zero, and the number of operating amplifiers in the peaking amplifier section 200d is one.

In this manner, when the combination of the amplifiers in the baseband amplifier section 100d and the peaking amplifier section 200d is changed, the emphasis amount is changed, and hence a desired emphasis amount with which the amount of jitter is minimized is obtained similarly to the above-mentioned second embodiment.

Further, the total drive current value is always the same for every combination to be selected, and hence there is an effect that the power consumption of the entire emphasis circuit is not increased, similarly to the above-mentioned second embodiment. In addition, one operating amplifier is selected from each of the baseband amplifier section 100d and the peaking amplifier section 200d based on the defined combination, and hence there is an effect that a desired emphasis amount is obtained more easily than in the above-mentioned second embodiment.

As described above, according to the fifth embodiment, the combinations of amplifiers in the baseband amplifier section and the peaking amplifier section are defined so that the total drive current value may be the same for every combination, and the drive current setting sections are adjusted so as to select any one of the combinations. Consequently, one operating amplifier is selected from each of the baseband amplifier section and the peaking amplifier section, and hence a desired emphasis amount is obtained more easily than in the above-mentioned second embodiment.

The invention claimed is:

1. An emphasis circuit for outputting a signal having frequency response characteristics that provide a gain depending on a frequency as a main signal output in response to differential input signals formed of an in-phase input signal and a reverse phase input signal,
the emphasis circuit comprising:
a baseband amplifier section configured to output a first output signal obtained by amplifying the differential input signals based on first frequency response characteristics in which a first gain is constant up to near a first predetermined frequency and the first gain becomes smaller over a whole frequency band as a first drive current value for operating the baseband amplifier section becomes smaller;
a peaking amplifier section configured to output a second output signal obtained by amplifying the differential input signals based on second frequency response characteristics in which a second gain peaks near a second predetermined frequency and the second gain becomes larger over the whole frequency band as a second drive current value for operating the peaking amplifier section becomes larger, the peaking amplifier section including a capacitor; and
a signal multiplexing section configured to output a multiplexed signal obtained by multiplexing the first output signal and the second output signal as the main signal output,
wherein each of the baseband amplifier section and the peaking amplifier section comprises a drive current setting section configured to adjust a drive current value for operating the each of the baseband amplifier section and the peaking amplifier section, and
wherein the drive current setting section of the each of the baseband amplifier section and the peaking amplifier section is adjusted so that a sum of the first drive current value for operating the baseband amplifier section and the second drive current value for operating the peaking amplifier section is constant, to thereby obtain an emphasis amount with which high frequency band deterioration is suppressed.

2. The emphasis circuit according to claim 1,
wherein the baseband amplifier section comprises:
a single baseband amplifier; and
a first variable current source, which corresponds to the drive current setting section included in the baseband amplifier section, and is configured to adjust the first drive current value for operating the single baseband amplifier,
wherein the peaking amplifier section comprises:
a single peaking amplifier; and
a second variable current source, which corresponds to the drive current setting section included in the peaking amplifier section, and is configured to adjust the second drive current value for operating the single peaking amplifier, and
wherein, when the emphasis amount is obtained, the first drive current value is adjusted by the first variable current source so as to be decreased and the second drive current value is adjusted by the second variable current source so as to be correspondingly increased.

3. The emphasis circuit according to claim 1,
wherein the baseband amplifier section comprises:
N baseband amplifiers connected in parallel to each other, where N is a natural number of 2 or more;
N first constant current sources, which are connected respectively to each of the N baseband amplifiers, for operating the each of the N baseband amplifiers; and
a first switching section, which corresponds to the drive current setting section included in the baseband amplifier section, and is configured to switch each of the N first constant current sources between an On state and an Off state,
wherein the peaking amplifier section comprises:
M peaking amplifiers connected in parallel to each other, where M is a natural number of 2 or more;
M second constant current sources, which are connected respectively to each of the M peaking amplifiers, for operating the each of the M peaking amplifiers; and
a second switching section, which corresponds to the drive current setting section included in the peaking amplifier section, and is configured to switch each of the M second constant current sources between an On state and an Off state, and
wherein, when the emphasis amount is to be obtained, numbers of operating amplifiers are adjusted among the N baseband amplifiers and the M peaking amplifiers through the switching between the On state and the Off state of the each of the N first constant current sources by the first switching section and the switching between the On state and the Off state of the each of the M second constant current sources by the second switching section so that a sum of the first drive current value, which corresponds to a sum of drive current values that flow through the N first constant current sources in the On state in order to operate the respective N baseband amplifiers, and the second drive current value, which corresponds to a sum of drive current values that flow through the M second constant current sources in the On state in order to operate the respective M peaking amplifiers, is equal before and after the adjustment of the numbers of operating amplifiers.

4. The emphasis circuit according to claim 3,
wherein the baseband amplifier section further comprises:
   a single fixed baseband amplifier connected in parallel to the N baseband amplifiers; and
   a third constant current source, which is connected correspondingly to the single fixed baseband amplifier, for operating the single fixed baseband amplifier,
wherein a drive current value flowing through the third constant current source is larger than a drive current value flowing through each of the N first constant current sources, and
wherein a sum of the drive current value flowing through the third constant current source and the drive current value flowing through the each of the N first constant current sources is the first drive current value.

5. The emphasis circuit according to claim 3, wherein each of the baseband amplifier section and the peaking amplifier section comprises a variable current source rather than a constant current source.

6. The emphasis circuit according to claim 1,
wherein the baseband amplifier section comprises:
   N baseband amplifiers connected in parallel to each other, where N is a natural number of 2 or more;
   N first constant current sources, which are connected respectively to each of the N baseband amplifiers, for operating the each of the N baseband amplifiers; and
   a first switching section, which corresponds to the drive current setting section included in the baseband amplifier section, and is configured to switch each of the N first constant current sources between an On state and an Off state,
wherein the peaking amplifier section comprises:
   N peaking amplifiers connected in parallel to each other;
   N second constant current sources, which are connected respectively to each of the N peaking amplifiers, for operating the each of the N peaking amplifiers; and
   a second switching section, which corresponds to the drive current setting section included in the peaking amplifier section, and is configured to switch each of the N second constant current sources between an On state and an Off state,
wherein combinations are defined in advance, in each of which a drive current value $I1(n)$ for an n-th baseband amplifier, where n is 2 or more and N or less, included in the baseband amplifier section and a drive current value $I2(n)$ for an n-th peaking amplifier included in the peaking amplifier section are changed so that a total drive current value $I(n)$ $(=I1(n)+I2(n))$ of the drive current value $I1(n)$ for the n-th baseband amplifier and the drive current value $I2(n)$ for the n-th peaking amplifier is equal for every n,
wherein a sum of the drive current values flowing through the N first constant current sources is the first drive current value, and a sum of the drive current values flowing through the N second constant current sources is the second drive current value, and
wherein, when the emphasis amount is to be obtained, the respective drive current values are adjusted by selecting a combination corresponding to the n-th baseband amplifier and the n-th peaking amplifier from among the predefined combinations through the switching between the On state and the Off state of the each of the N first constant current sources by the first switching section and the switching between the On state and the Off state of the each of the N second constant current sources by the second switching section.

7. The emphasis circuit according to claim 1, further comprising an emitter resistor inserted between each differential pair of transistors in the baseband amplifier section.

8. The emphasis circuit according to claim 1,
wherein each of the baseband amplifier section and the peaking amplifier section comprises a differential pair of transistors, and
wherein the transistors comprise bipolar transistors or MOSFETs.

9. The emphasis circuit according to claim 1,
wherein the peaking amplifier section includes:
   a differential pair of transistors; and
   a resistor inserted between the differential pair of transistors, and
wherein the capacitor is disposed in parallel with resistor.

* * * * *